(12) United States Patent
Oi

(10) Patent No.: US 7,973,392 B2
(45) Date of Patent: Jul. 5, 2011

(54) ELECTRONIC DEVICE AND METHOD FOR MANUFACTURING STRUCTURE FOR ELECTRONIC DEVICE

(75) Inventor: Hideo Oi, Sendai (JP)

(73) Assignee: Freescale Semiconductor, Inc., Austin, TX (US)

( * ) Notice: Subject to any disclaimer, the term of this patent is extended or adjusted under 35 U.S.C. 154(b) by 204 days.

(21) Appl. No.: 12/501,537

(22) Filed: Jul. 13, 2009

(65) Prior Publication Data

US 2010/0059868 A1 Mar. 11, 2010

(30) Foreign Application Priority Data

Sep. 9, 2008 (JP) .................................. 2008-231411

(51) Int. Cl.
*H01L 23/552* (2006.01)
*H01L 21/302* (2006.01)

(52) U.S. Cl. ......... 257/659; 257/E23.114; 257/E21.231; 438/689

(58) Field of Classification Search .................. 257/659, 257/E23.114, E21.231; 438/689
See application file for complete search history.

(56) References Cited

U.S. PATENT DOCUMENTS

| 5,798,557 | A | * | 8/1998 | Salatino et al. | 257/416 |
|---|---|---|---|---|---|
| 6,514,789 | B2 | * | 2/2003 | Denton et al. | 438/106 |
| 6,777,767 | B2 | * | 8/2004 | Badehi | 257/432 |
| 6,853,055 | B1 | * | 2/2005 | Kuang | 257/659 |
| 7,265,440 | B2 | * | 9/2007 | Zilber et al. | 257/678 |
| 2002/0086456 | A1 | | 7/2002 | Cunningham et al. | |
| 2004/0102021 | A1 | | 5/2004 | Sawyer et al. | |
| 2008/0185692 | A1 | * | 8/2008 | Salzman | 257/659 |

FOREIGN PATENT DOCUMENTS

WO    2004063089 A2    7/2004

* cited by examiner

*Primary Examiner* — Lex Malsawma
(74) *Attorney, Agent, or Firm* — Charles Bergere

(57) ABSTRACT

An electronic device including a shielded electronic element, and a method for manufacturing a shielding structure. An oxide film is formed on the surface of a silicon substrate having a [100] face. Part of the oxide film is removed to form a first window region. Silicon substrates are joined together to form an SOI substrate, which includes a buried mask having a second window region. Substrate thinning is then performed, and oxide films are formed on the two surfaces of the SOI substrate so that the first window region has a large area and includes the region above the buried second window region. Then, anisotropic etching is performed to form a cap that includes a step. Wire bonding for shielding is performed on the step.

5 Claims, 4 Drawing Sheets

ELECTRONIC DEVICE AND METHOD FOR MANUFACTURING STRUCTURE FOR ELECTRONIC DEVICE

BACKGROUND OF THE INVENTION

The present invention relates to an electronic device including a shielded electronic element and a method for manufacturing a shielding structure.

As a result of research in technology for miniaturizing elements, microelectromechanical system (MEMS) devices have been developed. Such an electronic device is formed on a semiconductor wafer and packaged. Examples of such a package include a can package, which uses a metal cap for sealing, and a ceramic package, which uses a ceramic cap for sealing.

Further, chip size package (CSP) technology has been developed for semiconductor integrated circuits laid out in high densities. A CSP is a package having a size that is about the same as a bare chip (semiconductor chip) on which a semiconductor integrated circuit is formed.

An acceleration sensor uses a package structure such as that shown in FIG. 5. In this structure, a sensor 70 is arranged on a substrate 50. Metal wiring (not shown) is connected to the sensor 70. A cap 30 seals the sensor 70. An adhesive 80 secures the cap 30 to the substrate 50.

To reduce stress between the cap 30 and the substrate 50, the cap 30 is formed from silicon, which is also used to form the substrate 50. A metal cap layer 40 is arranged on the cap 30. A bonding wire connects the metal cap layer 40 to a metal pad layer 41. The connection of the metal cap layer 40 and the metal pad layer 41 provides shielding with the cap 30.

A method for manufacturing the cap 30 will now be discussed with reference to FIG. 6.

First, referring to FIG. 6A, a silicon substrate 400 having a silicon surface with a crystalline orientation with a [100] face is prepared. Next, oxide films 410 and 420 are formed on the surfaces of the silicon substrate 400. As shown in FIG. 6B, part of the oxide film 420 is removed from one of the surfaces of the silicon substrate 400 to form a window region 425.

Next, anisotropic etching is performed. An anisotropic etching solution is used to process the silicon material. In this embodiment, tetramethyl-ammonium-hydroxide (TMAH) is used for etching. In a silicon crystal, a [111] face is only slightly etched by TMAH but the [100] face is etched at a rate of approximately 9000 μm/min. The etching rate of an oxide film is low, so an etching selectivity of approximately 5000 may be obtained in relation with a [100] face. Accordingly, an oxide film may be used as an etching stopper.

In this case, a hole 305 is formed as shown in FIG. 6C. A [111] face is formed on a side surface of the hole 305, and a [100] face is formed on a bottom surface. Etching stops when the oxide film 410 on the lower surface of the substrate 400 is reached.

Next, oxide film etching is performed to obtain the structure shown in FIG. 6D. In this case, the oxide films 410 and 420 are etched.

Subsequently, a predetermined process is performed in this state to manufacture the cap 30.

A method for manufacturing a semiconductor device that reduces the size of the device package and simplifies fabrication to reduce costs has been discussed (for example, refer to Japanese Laid-Open Patent Publication No. 2005-19966, page 1 and FIG. 3). In the technology described in this publication, a sealed device is formed on the surface of a semiconductor chip. A further semiconductor chip is attached to the surface of the semiconductor chip to seal the sealed device in a cavity formed between the semiconductor chips.

A method for manufacturing a semiconductor device that has a silicon on insulator (SOI) substrate, in which a semiconductor layer is superimposed on a semiconductor substrate with an insulation layer arranged in between, has been discussed (for example, refer to Japanese Laid-Open Patent Publication No. 2004-186228, page 1 and FIG. 1). In the technology described in this publication, an interlayer insulation layer is formed above the semiconductor layer of the SOI substrate. A mask pattern, which is used for the formation of a plurality of contact holes, is formed above the interlayer insulation layer. Then, first isotropic etching is performed to etch the interlayer insulation layer using the mask pattern as a mask. Next, anisotropic etching is performed to etch the interlayer insulation layer using the mask pattern as a mask. Subsequently, second isotropic etching is performed to etch the interlayer insulation layer using the mask pattern as a mask.

However, in the conventional cap structure described above, the metal cap layer and bonding wire are arranged on an upper surface of the cap, which increases the element height T0 (See FIG. 5). Increasing the height of the package is contrary to the goal of miniaturization. Further, for the miniaturization of MEMS devices, micro-processing is necessary. It is preferable that such processing be as simple as possible.

BRIEF DESCRIPTION OF THE DRAWINGS

The invention, together with objects and advantages thereof, may best be understood by reference to the following description of the presently preferred embodiments together with the accompanying drawings in which:

FIG. 3A is a diagram showing two wafers forming an SOI substrate, FIG. 3B is a diagram showing the SOI substrate with a window region, FIG. 3C is a diagram showing the SOI substrate in a thinned state, and FIG. 3D is a diagram showing an upper surface mask;

FIG. 4A is a diagram showing a state in which anisotropic etching is being performed, FIG. 4B is a diagram showing a state in which anisotropic etching reaches a buried mask, FIG. 4C is a diagram showing a state in which anisotropic etching reaches an etching stopper, and FIG. 4D is a diagram showing a state in which upper and lower surface masks have been removed;

FIG. 6A is a diagram showing a silicon substrate, FIG. 6B is a diagram showing masks, FIG. 6C is a diagram showing a state in which anisotropic etching reaches an etching stopper, and FIG. 6D is a diagram showing a state in which upper and lower surface masks are removed.

DETAILED DESCRIPTION OF THE PREFERRED EMBODIMENTS

The present invention provides a reduced size electronic device including a shielded electronic element, as well as a method for efficiently manufacturing a shielding structure.

One aspect of the present invention is an electronic device including a structure for shielding an electronic element arranged on a substrate. The electronic device includes a first shield formed from the same material as the substrate and attached to the substrate such that it covers the electronic element. A second shield is arranged on the first shield. An electrode is electrically connected to the substrate. The electrode is arranged on an upper surface of the first shield at a step that is not covered by the second shield.

Another aspect of the present invention is a method for manufacturing a structure for shielding an electronic element arranged on a substrate. The method includes forming a surface mask on a surface of the substrate, which includes a buried mask layer having a first window region; forming a second window region, which overlaps the first window region, in the surface mask; and performing directive etching using the first and second window regions.

Other aspects and advantages of the present invention will become apparent from the following description, taken in conjunction with the accompanying drawings, illustrating by way of example the principles of the invention.

An embodiment of an electronic device according to the present invention will now be discussed with reference to FIGS. 1 to 4. A package including a cap that seals a sensor, which is arranged on a substrate, will be discussed here.

[Cap Structure]

Figure 1:
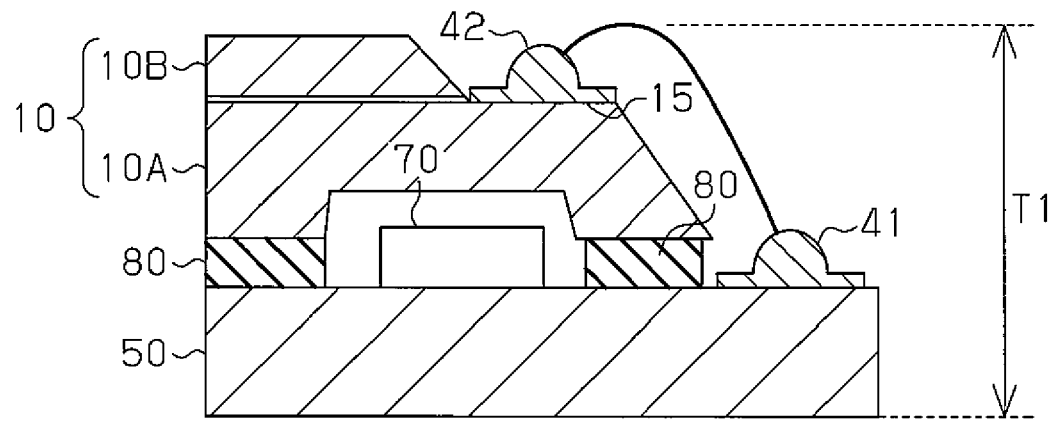
FIG. 1 is a cross-sectional diagram of an embodiment of an element structure of the present invention.

Referring to FIG. 1, a package includes a substrate 50 and a sensor 70. The sensor 70 is arranged on the substrate 50 and functions as an electronic element. Metal wiring (not shown) is connected to the sensor 70. A cap 10 protects the sensor 70. The cap 10 is affixed to the substrate 50 with an adhesive 80.

The cap 10 includes a first shield 10A and a second shield 10B that is arranged on the first shield 10A. A step 15 is formed between the ends of the first and second shields 10A and 10B. A metal cap layer 42 is arranged on the step 15. A bonding wire connects the metal cap layer 42 to a metal pad layer 41. The connection of the metal cap layer 42 and the metal pad layer 41 provides shielding with the cap 10.

[Method for Manufacturing the Cap]

Figure 2:
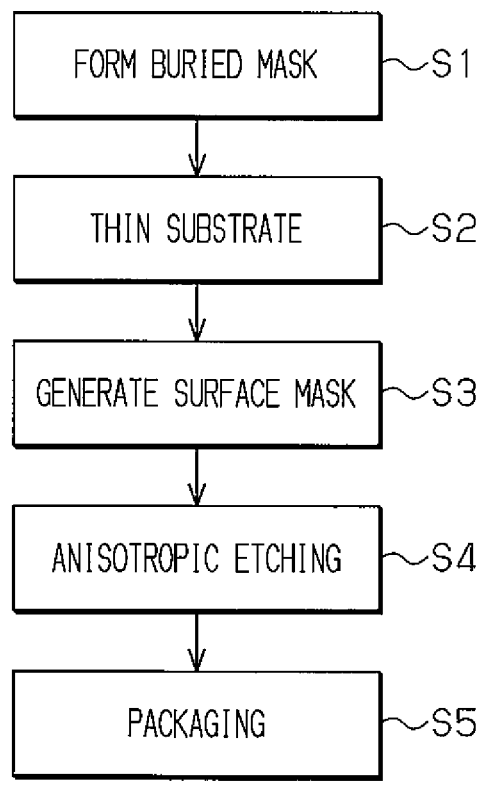
FIG. 2 is a flowchart of a method for manufacturing a cap structure in accordance with an embodiment of the present invention.

A method for manufacturing the cap 10 will now be discussed with reference to FIG. 2.

First, a buried mask is formed (step S1). More specifically, referring to FIG. 3A, two silicon substrates 100 and 110 are prepared. In one embodiment, substrates of which silicon surfaces have the crystalline orientation of a [100] face are prepared. Further, an oxide film is used as the mask. Here, an oxide film 201 is formed on the surface of the silicon substrate 100, and part of the oxide film 201 is removed to form a window region 205. The window region 205 serves as a first window region.

Figure 3A:
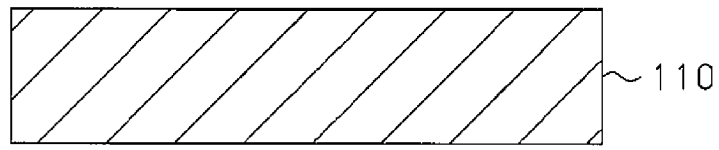
FIGS. 3A to 3D are diagrams illustrating a process for manufacturing a cap structure in accordance with an embodiment of the present invention, where
Figure 3A:
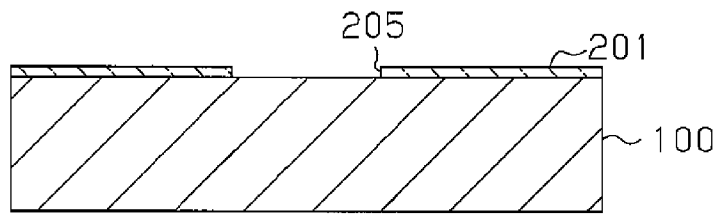
Figure 3B:
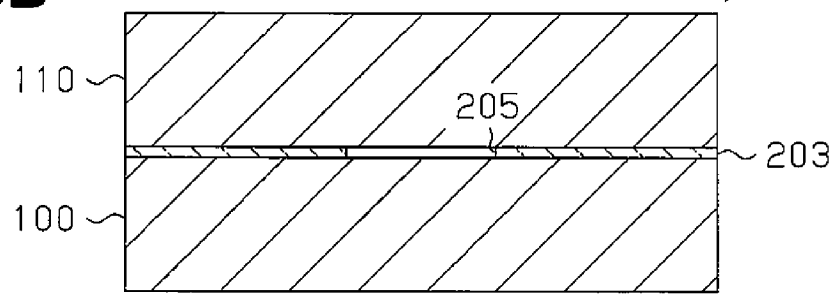

Referring to FIG. 3B, the two silicon substrates 100 and 110 are joined together. In one embodiment, a technique for directly affixing the substrate 110 to the substrate 100 includes heating and joining the silicon substrates 100 and 110 in a superimposed state. This forms a buried oxide layer 203, which serves as a buried mask layer, from the oxide film 201. In this way, an SOI substrate 100a, which includes the window region 205, is formed.

Figure 3C:
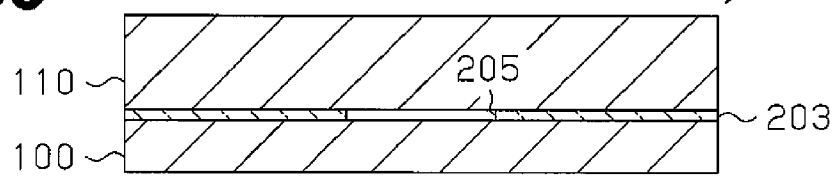
Figure 3D:
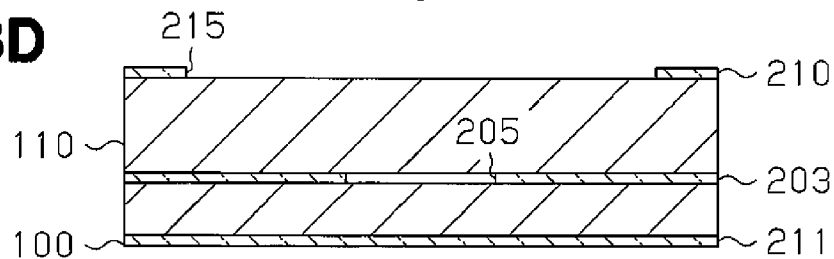

Next, the substrate is thinned (step S2). More specifically, the upper and lower surfaces of the SOI substrate 100a are ground and polished to thin the silicon substrates 100 and 110. This forms a thinned SOI substrate 100b as shown in FIG. 3C.

Then, surface masks are generated (step S3). More specifically, oxide films 210 and 211 are formed on the upper and lower surfaces of the SOI substrate 100b. Part of the oxide film 210 (surface mask) on the upper surface is removed to form a window region 215. In one embodiment, referring to FIG. 3D, the window region 215, which has a large area, includes the region above the buried window region 205. The window region 215 functions as a second window region.

For example, in one embodiment, lithography that transmits infrared light is used to form the window region 215 while adjusting the positional relationship with the window region 205. In this case, anisotropic etching is performed as will be described later. Thus, compared to the edge of the window region 205, due to crystalline orientation, the edge of the window region 215 is located at a position separate from a region at which an inclined surface of a side wall extends.

Figure 4A:
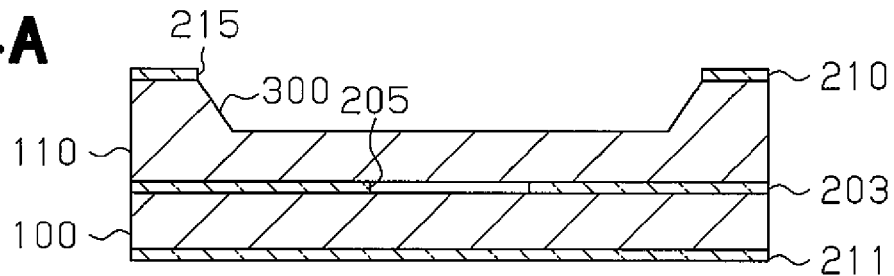
FIGS. 4A to 4D are diagrams illustrating a process for manufacturing a cap structure in accordance with an embodiment of the present invention, where

At step S4, anisotropic etching is performed. An etching solution (such as TMAH) that is anisotropic to silicon is used for processing. When etching has been performed for a certain time, a hole 300 is formed using the oxide film 210, which includes the window region 215, as a mask, as shown in FIG. 4A. The hole 300 has a bottom surface from which a [100] face is exposed due to anisotropic etching. A [111] face is exposed from the side surface.

Figure 4B:
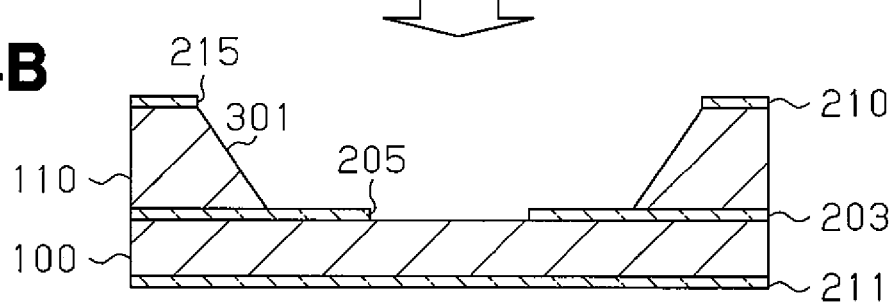
Figure 4C:
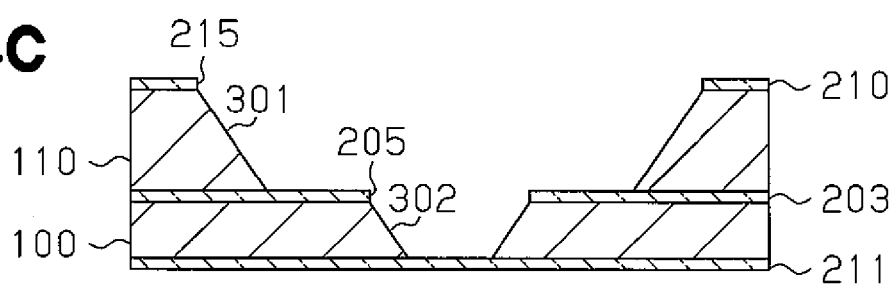

Referring to FIG. 4B, additional etching is performed until a hole 301 reaches the buried oxide layer 203. In this case, the buried oxide layer 203 stops the etching of the hole 301. Then, further etching is performed using the buried oxide layer 203, which includes the window region 205, as a mask. In this case, referring to FIG. 4C, the silicon substrate 100 exposed by the window region 205 is etched.

Here, a [111] face has a low etching rate. Thus, as the side wall having a [111] face is formed, the bottom surface having a [100] face is etched to form a hole 302. Then, when the oxide film 211 is reached, the etching stops.

Figure 4D:
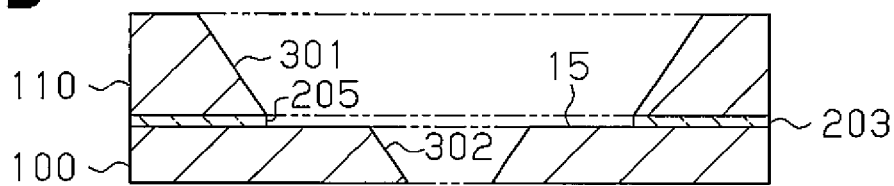
Figure 5:
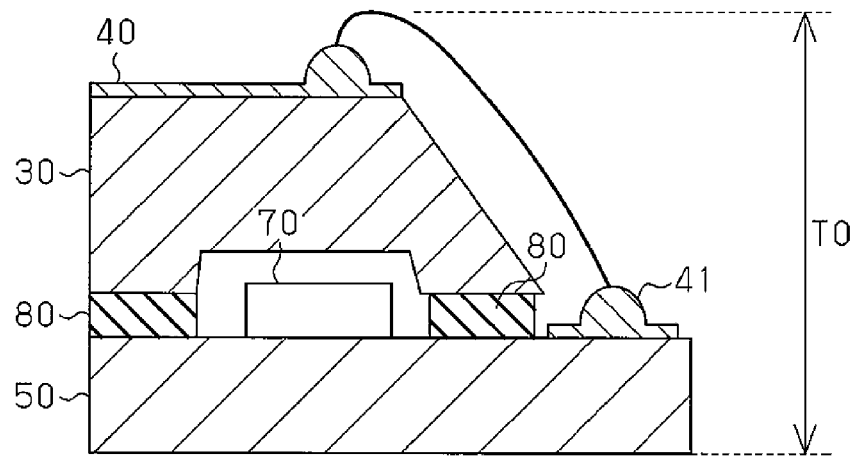
FIG. 5 is a diagram showing a conventional element structure.
Figure 6A:
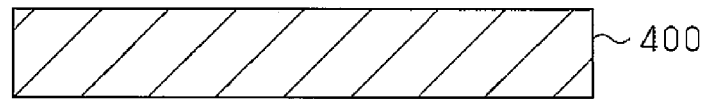
FIGS. 6A to 6D are diagrams illustrating a process for manufacturing a conventional cap structure, where
Figure 6B:
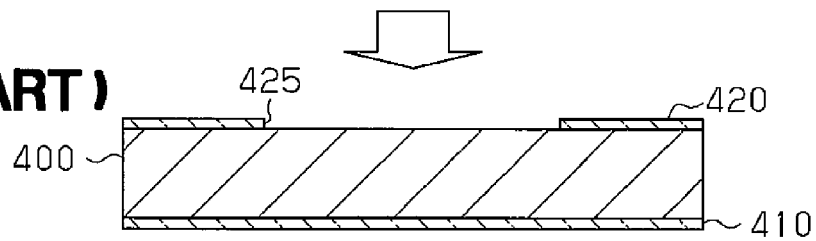
Figure 6C:
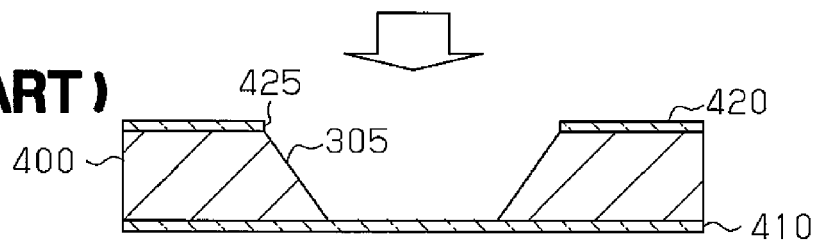
Figure 6D:

Subsequently, the oxide film 211 is etched to obtain the structure shown in FIG. 4D. In this case, the oxide film 210 on the silicon substrate 110 and the exposed part of the buried oxide layer 203 are etched. This forms a step 15.

Then, packaging is performed (step S5). More specifically, a cap structure is formed by processing a substrate that includes such a step so as to seal the sensor 70 on the substrate 50.

In a preferred embodiment, the cap 10 includes the step 15. The metal cap layer 42 is arranged on the step 15. The metal cap layer 42 is connected to the metal pad layer 41 on the substrate 50 with a bonding wire. This allows for lowering of the position of the bonding wire, which shields the cap 10. Thus, as shown in FIG. 1, the element height T1 is lowered. This allows for the miniaturization of an electronic element.

In the preferred embodiment, a buried mask is formed (step S1). This forms the window region 205 in the buried oxide layer 203 of the SOI substrate 100a. Then, surface masks are formed (step S3). This forms the oxide films 210 and 211 on the two surfaces of the SOI substrate 100b. Part of the oxide film 210 is removed from the upper surface of the SOI substrate 100b to form the window region 215. The window region 215, which has a large area, includes the region above the buried widow region 205. This forms the first window region, which is buried in the substrate, and the second window region, of which positional relationship with the first window region is adjusted. As a result, by performing anisotropic etching once, a first structure having a large area and a second structure arranged on the first structure are formed.

Due to the difference in areas, a step is formed on the upper surface first structure. This step may be used for shield bonding. Further, the oxide film 211 on the lower surface of the SOI substrate 100b may be used as an etching stopper.

It should be apparent to those skilled in the art that the present invention may be embodied in many other specific forms without departing from the spirit or scope of the invention. Particularly, it should be understood that the present invention may be embodied in the following forms.

In the preferred embodiment, TMAH is used as the anisotropic etching solution. However, the etching solution is not limited to TMAH. For example, KOH may be used as the etching solution. Further, other etching solutions may be used by forming the etching stopper from other materials (e.g., nitride film).

In the preferred embodiment, anisotropic etching is performed during processing. However, the present invention is not limited to such etching. For instance, etching having directivity may be performed. As an example, etching having directivity and using an ion stream may be performed.

In the preferred embodiment, an SOI substrate is formed by employing direct adhering technology. However, the method for forming an SOI substrate is not limited in such a manner. For example, an SOI substrate may be formed by employing separation by implanted oxygen (SIMOX) or the like.

In the preferred embodiment, the window region 215 has a large area and includes the region above the buried window region 205. The window regions 205 and 215 only need to be located at positions separated from a region at which an inclined surface of a side wall is extended by directive etching so as to partially form a step.

The present examples and embodiments are to be considered as illustrative and not restrictive, and the invention is not to be limited to the details given herein, but may be modified within the scope and equivalence of the appended claims.

What is claimed is:

1. An electronic device including a structure for shielding an electronic element arranged on a substrate, the electronic device comprising:
    a first shield formed from the same material as the substrate and affixed to the substrate so as to cover the electronic element;
    a second shield arranged on the first shield; and
    an electrode electrically connected to the substrate, wherein the electrode is arranged on an upper surface of the first shield at a step that is not covered by the second shield.

2. A method for manufacturing a structure for shielding an electronic element arranged on a substrate, the method comprising:
    forming a surface mask on a surface of the substrate, wherein the substrate includes a buried mask layer having a first window region;
    forming a second window region, which overlaps the first window region, in the surface mask; and
    performing directive etching using the first and second window regions.

3. The method for manufacturing a structure for shielding an electronic element arranged on a substrate of claim 2, wherein the mask is an oxide film.

4. The method for manufacturing a structure for shielding an electronic element arranged on a substrate of claim 2, wherein the directive etching includes anisotropic etching having an etching rate that varies depending on the crystalline orientation of the substrate.

5. The method for manufacturing a structure for shielding an electronic element arranged on a substrate of claim 2, wherein the substrate is a silicon substrate having a face orientation of [100].

* * * * *